(12) United States Patent
Li et al.

(10) Patent No.: US 12,178,039 B2
(45) Date of Patent: Dec. 24, 2024

(54) MEMORY DEVICE HAVING MERGED ACTIVE AREA

(71) Applicant: NANYA TECHNOLOGY CORPORATION, New Taipei (TW)

(72) Inventors: Wei-Zhong Li, Taoyuan (TW); Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 406 days.

(21) Appl. No.: 17/543,966

(22) Filed: Dec. 7, 2021

(65) Prior Publication Data

US 2023/0180470 A1 Jun. 8, 2023

(51) Int. Cl.
*H10B 20/20* (2023.01)
*H10B 20/25* (2023.01)

(52) U.S. Cl.
CPC .............. *H10B 20/25* (2023.02); *H10B 20/20* (2023.02)

(58) Field of Classification Search
CPC ................................. H10B 20/20; H10B 20/25
See application file for complete search history.

(56) References Cited

U.S. PATENT DOCUMENTS

| | | | |
|---|---|---|---|
| 9,123,572 B2 | 9/2015 | Kurjanowicz | |
| 9,496,033 B2 | 11/2016 | Chung | |
| 2011/0298054 A1* | 12/2011 | Luan | H10B 20/20 257/369 |
| 2014/0293673 A1* | 10/2014 | Wu | H10B 20/20 365/96 |
| 2016/0079354 A1 | 3/2016 | Park et al. | |
| 2016/0099251 A1* | 4/2016 | Yamamoto | H10B 20/20 257/350 |

FOREIGN PATENT DOCUMENTS

| TW | I502722 B | 10/2015 |
|---|---|---|
| TW | 202133395 A | 9/2021 |

OTHER PUBLICATIONS

Taiwanese Office Action dated Jan. 4, 2023 in application No. 111106575 and the search report attached to the Office Action; pp. 1-3.

\* cited by examiner

*Primary Examiner* — Peter M Albrecht
(74) *Attorney, Agent, or Firm* — MUNCY, GEISSLER, OLDS & LOWE, P.C.

(57) ABSTRACT

The present application provides a memory device. The memory device includes a semiconductor substrate including an isolation structure and an active area surrounded by the isolation structure; a fuse gate structure disposed over the active area; a device gate structure disposed over the active area and adjacent to the fuse gate structure; and a contact plug coupled to the active area and extending away from the semiconductor substrate, wherein at least a portion of the active area is disposed under the device gate structure. Further, a method of manufacturing the memory device is also disclosed.

20 Claims, 12 Drawing Sheets mark# MEMORY DEVICE HAVING MERGED ACTIVE AREA

TECHNICAL FIELD

The present disclosure relates to a memory device and a manufacturing method thereof, and more particularly, to a semiconductor device including a merged active area (AA) and a manufacturing method of the semiconductor device.

DISCUSSION OF THE BACKGROUND

Nonvolatile memory devices can retain data even when their power supply is cut off. One type of nonvolatile memory device is a one-time-programmable (OTP) memory device. With the OTP memory device, a user can program the OTP memory device only once, and data stored in the OTP memory device cannot be modified. The OTP memory device includes a fuse that is initially in a short status, and after being programmed is in an open status. A signal is transmitted to the fuse through a metallic interconnect disposed above a semiconductive substrate.

However, such routing of the metallic interconnect presents an obstacle to increasing routing density of the memory device and therefore limits reduction of minimum feature size. It is therefore desirable to develop improvements that address related manufacturing challenges.

SUMMARY

One aspect of the present disclosure provides a memory device. The memory device includes a semiconductor substrate including an isolation structure and an active area surrounded by the isolation structure; a fuse gate structure disposed over the active area; a device gate structure disposed over the active area and adjacent to the fuse gate structure; and a contact plug coupled to the active area and extending away from the semiconductor substrate, wherein the active area is disposed below and crosses under the fuse gate structure and the device gate structure.

In some embodiments, the active area, from a top view, extends between the contact plug and the fuse gate structure.

In some embodiments, the fuse gate structure and the device gate structure are parallel.

In some embodiments, the fuse gate structure and the device gate structure extend vertically above the active area.

In some embodiments, the active area is substantially perpendicular, from a top view, to the fuse gate structure and the device gate structure.

In some embodiments, the device gate structure is disposed between the fuse gate structure and the contact plug.

In some embodiments, an electric current can flow from the contact plug to the fuse gate structure through the active area.

In some embodiments, the fuse gate structure includes a fuse gate dielectric disposed over the semiconductor substrate and a fuse gate electrode disposed over the fuse gate dielectric.

In some embodiments, the fuse gate dielectric is at least partially disposed on the active area.

In some embodiments, the fuse gate electrode includes polysilicon.

In some embodiments, the device gate structure includes a device gate dielectric disposed over the semiconductor substrate and a device gate electrode disposed over the device gate dielectric.

In some embodiments, the device gate dielectric is at least partially disposed on the active area.

In some embodiments, the device gate electrode includes polysilicon.

In some embodiments, the memory device further includes a metallic member disposed over and coupled to the contact plug.

In some embodiments, the space above the fuse gate structure is free of the metallic member.

In some embodiments, the metallic member is electrically connected to the fuse gate structure through the active area and the contact plug.

Another aspect of the present disclosure provides a memory device. The memory device includes a substrate including an isolation structure and a plurality of active areas surrounded by the isolation structure; a fuse gate structure disposed above and crossing over the plurality of active areas; a device gate structure disposed above and crossing over the plurality of active areas and adjacent to the fuse gate structure; and a plurality of contact plugs correspondingly coupled to the plurality of active areas and extending away from the substrate, wherein each of the plurality of active areas is at least partially disposed under the fuse gate structure and the device gate structure.

In some embodiments, the plurality of active areas are separated from each other by the isolation structure.

In some embodiments, the plurality of contact plugs are aligned with each other.

In some embodiments, the plurality of contact plugs are separated from each other by a dielectric layer disposed over the substrate.

In some embodiments, the memory device further includes a metallic member disposed over the dielectric layer and coupled to one of the plurality of contact plugs.

In some embodiments, the fuse gate structure and the device gate structure are parallel to each other, and cross over the plurality of active areas.

In some embodiments, a signal can be transmitted from one of the plurality of contact plugs to the fuse gate structure through one of the plurality of active areas.

In some embodiments, the substrate is semiconductive.

Another aspect of the present disclosure provides a method of manufacturing a memory device. The method includes steps of providing a substrate including an isolation structure and an active area surrounded by the isolation structure; forming a fuse gate structure over the active area; forming a device gate structure over the active area and adjacent to the fuse gate structure; and forming a contact plug coupled to the active area and extending away from the substrate, wherein the fuse gate structure and the device gate structure are parallel and are formed over the active area.

In some embodiments, the formation of the fuse gate structure and the formation of the device gate structure are performed separately and sequentially.

In some embodiments, the formation of the fuse gate structure is performed prior to the formation of the device gate structure.

In some embodiments, the formation of the device gate structure is performed prior to the formation of the fuse gate structure.

In some embodiments, the contact plug is formed by electroplating.

In some embodiments, the method further includes disposing a dielectric layer over the substrate.

In some embodiments, the fuse gate structure and the device gate structure are surrounded by the dielectric layer.

In some embodiments, the contact plug is formed after the disposing of the dielectric layer.

In some embodiments, the contact plug is formed by removing a portion of the dielectric layer to form a recess and filling the recess with a conductive material.

In some embodiments, the portion of the dielectric layer is removed by etching.

In some embodiments, the method further includes forming a metallic member over the contact plug.

In conclusion, because a signal can be transmitted through an active area over a substrate rather than through a metallic interconnect above the substrate, an area occupied by the metallic interconnect can be substantially reduced or even no longer occupied. Further, because a device gate structure can be formed adjacent to a fuse gate structure, an area occupied by the device gate structure can also be substantially reduced. Therefore, an overall dimension of the memory device can be substantially decreased.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
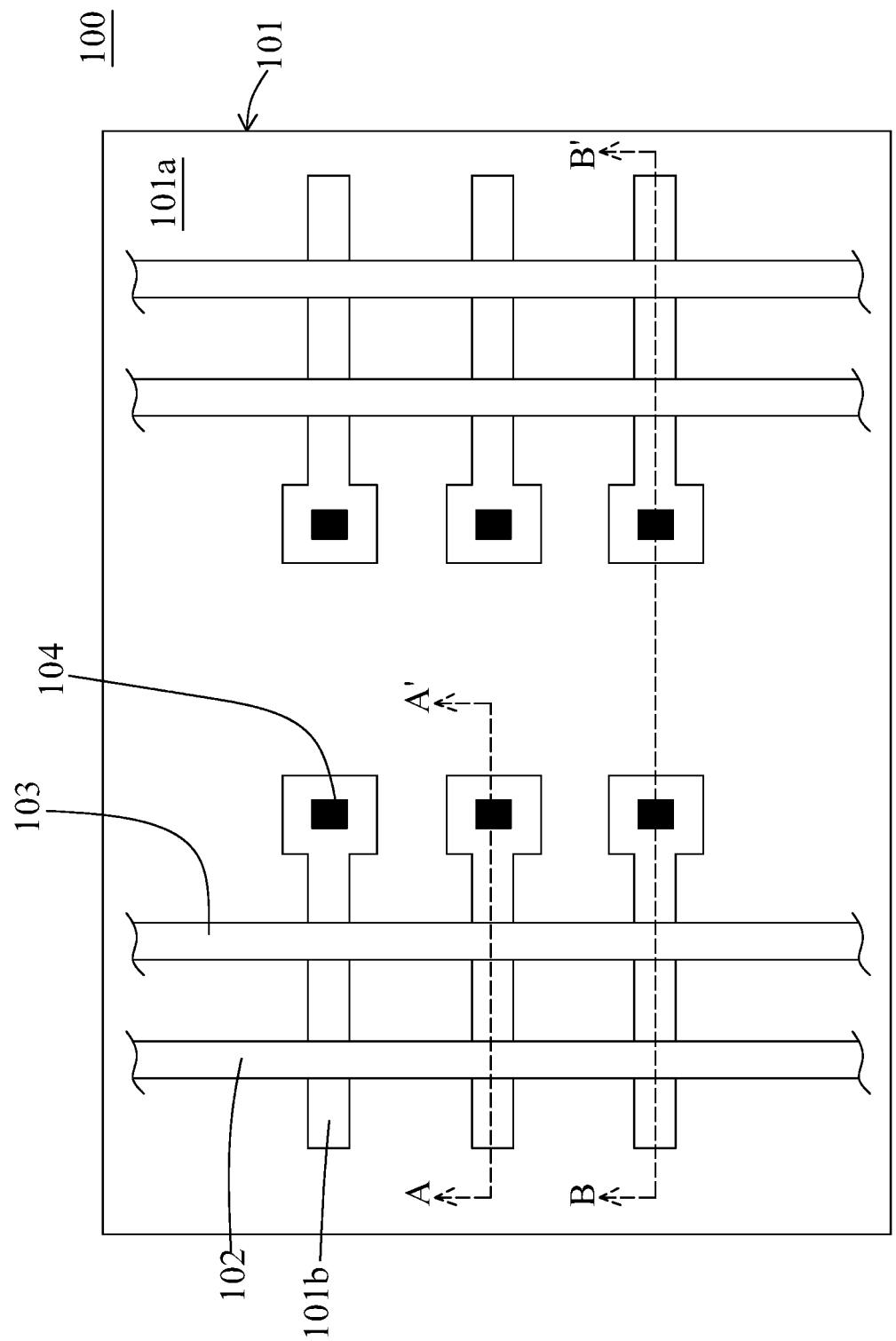
FIG. 1 is a top cross-sectional view of a memory device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
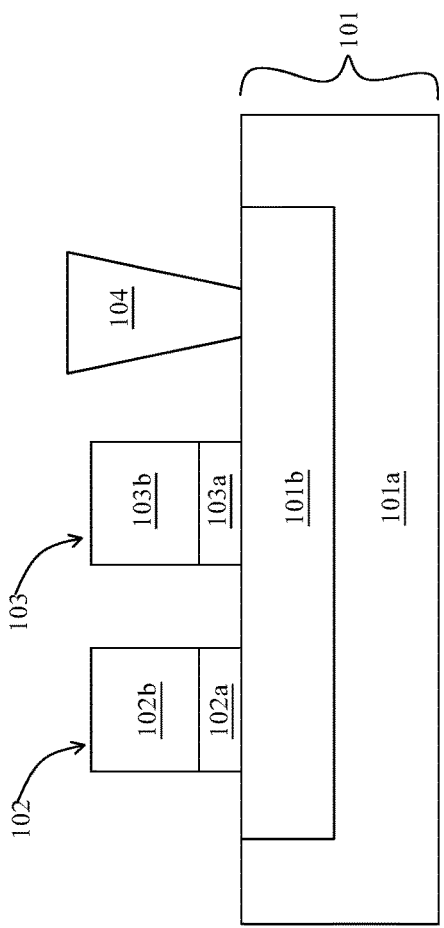
FIG. 2 is an embodiment of a cross-sectional side view of the memory device along a line A-A' in FIG. 1.
Figure 3:
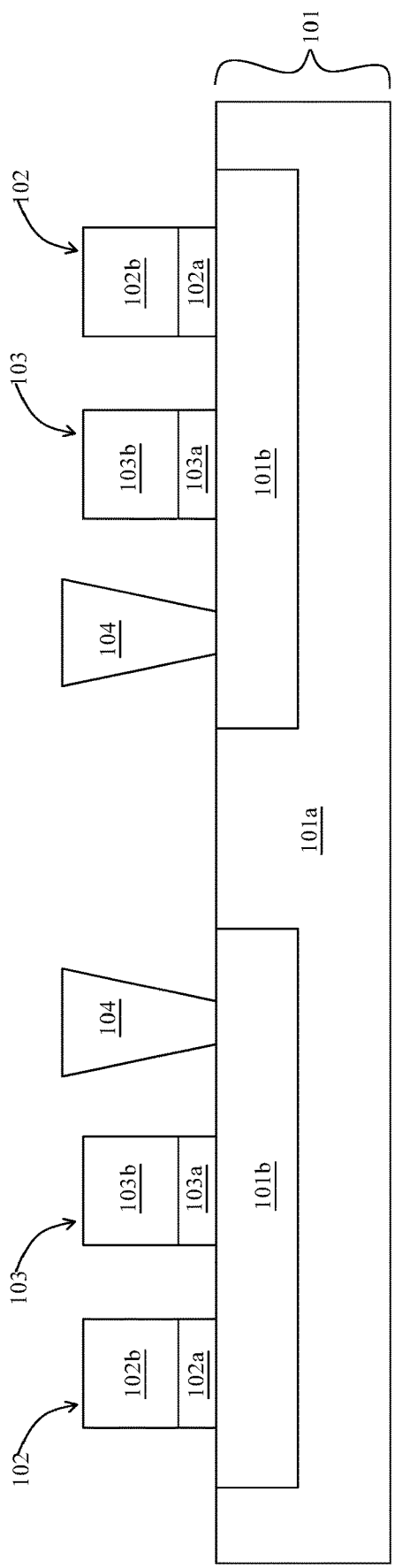
FIG. 3 is an embodiment of a cross-sectional side view of the memory device along a line B-B' in FIG. 1.

FIG. 1 is a schematic top cross-sectional view of a memory device 100 in accordance with some embodiments of the present disclosure. FIG. 2 is a schematic cross-sectional side view of the memory device 100 along a line A-A' in FIG. 1. FIG. 3 is a schematic cross-sectional side view of the memory device 100 along a line B-B' in FIG. 1. In some embodiments, the memory device 100 includes several unit cells arranged along rows and columns. In some embodiments, the memory device 100 is a fuse type memory device.

In some embodiments, the memory device 100 includes a semiconductor substrate 101. In some embodiments, the semiconductor substrate 101 is semiconductive in nature. In some embodiments, the semiconductor substrate 101 is a semiconductor wafer (e.g., a silicon wafer) or a semiconductor-on-insulator (SOI) wafer (e.g., a silicon-on-insulator wafer). In some embodiments, the semiconductor substrate 101 is a silicon substrate.

In some embodiments, the semiconductor substrate 101 includes an isolation structure 101a and an active area (AA) 101b surrounded by the isolation structure 101a. In some embodiments, the isolation structure 101a is formed of an insulating material, such as silicon oxide, silicon nitride, silicon oxynitride, the like or a combination thereof.

In some embodiments, the isolation structure 101a is a trench isolation structure extending into the semiconductor substrate 101 from a top surface of the semiconductor substrate 101. In some embodiments, a depth of the isolation structure 101a is substantially greater than, equal to or less than a depth of the active area 101b. In some embodiments, the isolation structure 101a is a shallow trench isolation (STI). In some embodiments, the isolation structure 101a defines a boundary of the active area 101b.

In some embodiments, the active area 101b is entirely surrounded by the isolation structure 101a. In some embodiments, the semiconductor substrate 101 includes several active areas 101b disposed over the semiconductor substrate 101. In some embodiments, each of the active areas 101b is surrounded by the isolation structure 101a, such that the active areas 101b are separated and electrically isolated from each other by the isolation structure 101a. In some embodiments, the active areas 101b are arranged along a column direction.

In some embodiments, the active area 101*b* is a doped region in the semiconductor substrate 101. In some embodiments, the active area 101*b* extends horizontally over or under the top surface of the semiconductor substrate 101. In some embodiments, each of the active areas 101*b* includes a same type of dopant. In some embodiments, each of the active areas 101*b* includes a type of dopant that is different from the types of dopants included in other active areas 101*b*. In some embodiments, each of the active areas 101*b* has a same conductive type. In some embodiments, the active area 101*b* includes N type dopants.

In some embodiments, the memory device 100 includes a fuse gate structure 102 disposed over the semiconductor substrate 101. In some embodiments, the fuse gate structure 102 is disposed over the active area 101*b* of the semiconductor substrate 101. In some embodiments, the fuse gate structure 102 is electrically connected to a fuse bit line. In some embodiments, the fuse gate structure 102 can be blown when a breakdown voltage is applied. In some embodiments, the fuse gate structure 102 is disposed above and crosses over the active area 101*b*. In some embodiments, the fuse gate structure 102 is substantially perpendicular, from a top view, to the active area 101*b*.

In some embodiments, the fuse gate structure 102 includes a fuse gate dielectric 102*a* and a fuse gate electrode 102*b* disposed over the fuse gate dielectric 102*a*. In some embodiments, the fuse gate dielectric 102*a* is disposed over the semiconductor substrate 101. In some embodiments, the fuse gate dielectric 102*a* is in contact with the active area 101*b*. The fuse gate dielectric 102*a* is at least partially disposed on the active area 101*b*. In some embodiments, the fuse gate dielectric 102*a* includes oxide or metal containing oxide. In some embodiments, the fuse gate dielectric 102*a* includes silicon oxide. In some embodiments, the fuse gate dielectric 102*a* can be broken or damaged during the dielectric breakdown process.

In some embodiments, the fuse gate electrode 102*b* is disposed over the fuse gate dielectric 102*a*. In some embodiments, the fuse gate electrode 102*b* includes polysilicon, silicide or the like. In some embodiments, a masking layer is disposed between the fuse gate dielectric 102*a* and the fuse gate electrode 102*b*. In some embodiments, the masking layer includes silicon nitride, silicon oxynitride, the like or a combination thereof.

In some embodiments, the memory device 100 includes a device gate structure 103 adjacent to the fuse gate structure 102. The device gate structure 103 is disposed over the semiconductor substrate 101. In some embodiments, the device gate structure 103 is disposed over the active area 101*b* of the semiconductor substrate 101. In some embodiments, the device gate structure 103 is parallel to the fuse gate structure 102. In some embodiments, the device gate structure 103 is disposed above and crosses over the active area 101*b*. In some embodiments, the device gate structure 103 is substantially perpendicular, from a top view, to the active area 101*b*.

In some embodiments, the device gate structure 103 includes a device gate dielectric 103*a* and a device gate electrode 103*b* disposed over the device gate dielectric 103*a*. In some embodiments, the device gate dielectric 103*a* is disposed over the semiconductor substrate 101. In some embodiments, the device gate dielectric 103*a* is in contact with the active area 101*b*. The device gate dielectric 103*a* is at least partially disposed on the active area 101*b*. In some embodiments, the device gate dielectric 103*a* includes oxide or metal containing oxide. In some embodiments, the device gate dielectric 103*a* includes silicon oxide.

In some embodiments, the device gate electrode 103*b* is disposed over the device gate dielectric 103*a*. In some embodiments, the device gate electrode 103*b* includes polysilicon, silicide or the like. In some embodiments, a masking layer is disposed between the device gate dielectric 103*a* and the device gate electrode 103*b*. In some embodiments, the masking layer includes silicon nitride, silicon oxynitride, the like or a combination thereof.

In some embodiments, the active area 101*b* is disposed below and crosses under the fuse gate structure 102 and the device gate structure 103. In some embodiments, the active area 101*b* is disposed under the fuse gate structure 102 and the device gate structure 103 and, from a top view, extends between the fuse gate structure 102 and the device gate structure 103. A portion of the active area 101*b* under the fuse gate structure 102 and a portion of the active area 101*b* under the device gate structure 103 are merged.

In some embodiments, the fuse gate structure 102 and the device gate structure 103 extend vertically above the active area 101*b*. The active area 101*b* is substantially perpendicular, from a top view, to the fuse gate structure 102 and the device gate structure 103. In some embodiments, the fuse gate structure 102 and the device gate structure 103 are parallel and cross over the active areas 101*b*. Each of the active areas 101*b* is at least partially disposed under the fuse gate structure 102 and the device gate structure 103.

In some embodiments, the memory device 100 includes a contact plug 104 disposed over the semiconductor substrate 101. In some embodiments, the contact plug 104 is coupled to and in contact with the active area 101*b* of the semiconductor substrate 101. In some embodiments, the memory device 100 includes several contact plugs 104 disposed on and correspondingly coupled to the active areas 101*b*.

In some embodiments, the contact plug 104 extends from the active area 101*b* and away from the semiconductor substrate 101. In some embodiments, from a top view, the active area 101*b* extends between the contact plug 104 and the fuse gate structure 102 or between the contact plug 104 and the device gate structure 103. In some embodiments, the device gate structure 103 is disposed between the fuse gate structure 102 and the contact plug 104. In some embodiments, the contact plugs 104 are aligned with each other. In some embodiments, the contact plugs 104 are vertically aligned.

In some embodiments, the contact plug 104 includes conductive material such as copper, silver, gold or the like. In some embodiments, the contact plug 104 has a tapered shape. In some embodiments as shown in FIG. 3, an area between two horizontally aligned contact plugs is free of the device gate structure 103.

In some embodiments, a conductive path is formed along the active area 101*b* and between the contact plug 104 and the fuse gate structure 102. An electric current can flow from the contact plug 104 to the fuse gate structure 102 through the active area 101*b*. In some embodiments, a signal can be transmitted from the contact plug 104 to the fuse gate structure through the active area 10*b*. In some embodiments, the conductive path is formed across the fuse gate dielectric 102*a* when a voltage is applied from the contact plug 104 to the fuse gate structure 102 through the active area 101*b*.

Figure 4:
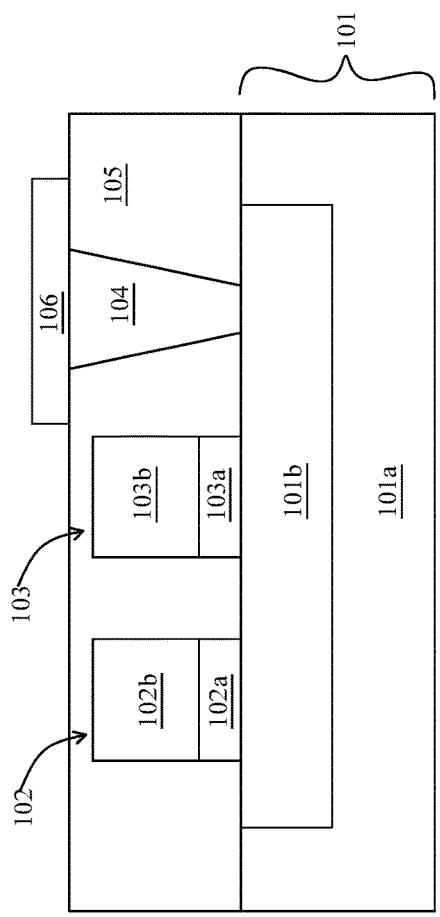
FIG. 4 is another embodiment of a cross-sectional side view of the memory device along the line A-A' in FIG. 1.
Figure 5:
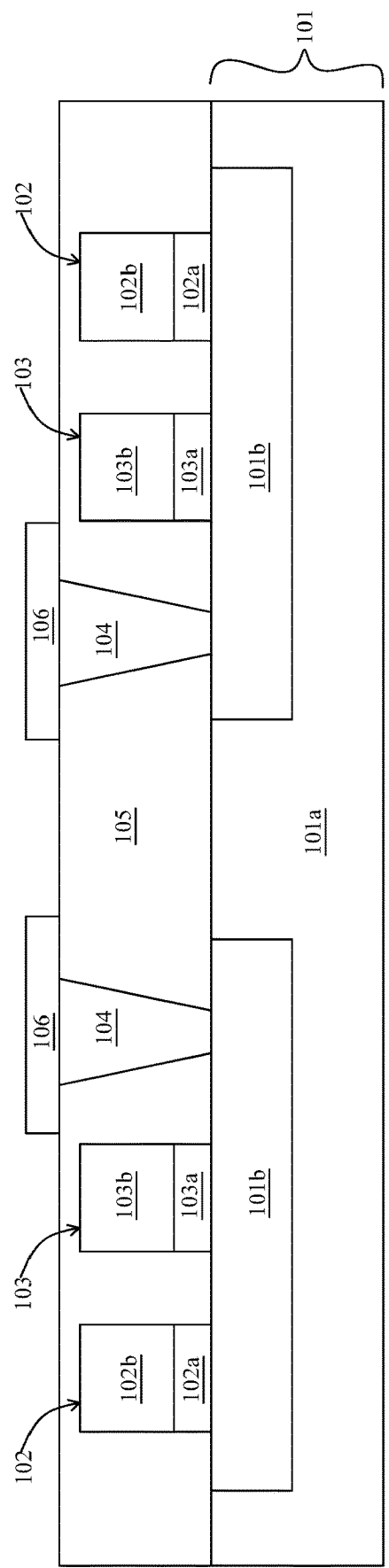
FIG. 5 is another embodiment of a cross-sectional side view of the memory device along the line B-B' in FIG. 1.

In some embodiments, a dielectric layer 105 is disposed over the semiconductor substrate 101 and surrounds the fuse gate structure 102, the device gate structure 103 and the contact plug 104 as shown in FIGS. 4 and 5. In some embodiments, the dielectric layer 105 covers the fuse gate structure 102 and the device gate structure 103. In some embodiments, a top surface of the contact plug 104 is exposed through the dielectric layer 105.

In some embodiments, the fuse gate structure 102, the device gate structure 103 and the contact plug 104 are isolated from each other by the dielectric layer 105. In some embodiments, the contact plugs 104 are separated from each other by the dielectric layer 105. In some embodiments, the dielectric layer 105 includes dielectric material such as oxide, polymer or the like.

In some embodiments, a metallic member 106 is disposed over and coupled to the contact plug 104 as shown in FIGS. 4 and 5. In some embodiments, the metallic member 106 is disposed over the dielectric layer 105. In some embodiments, a portion of the metallic member 106 is in contact with the dielectric layer 105. In some embodiments, the metallic member 106 is electrically connected to the fuse gate structure 102 through the active area 101b and the contact plug 104. In some embodiments, the space over the fuse gate structure 102 is free of the metallic member 106. In some embodiments, the metallic member 106 includes conductive material such as copper, silver, gold or the like.

Figure 6:
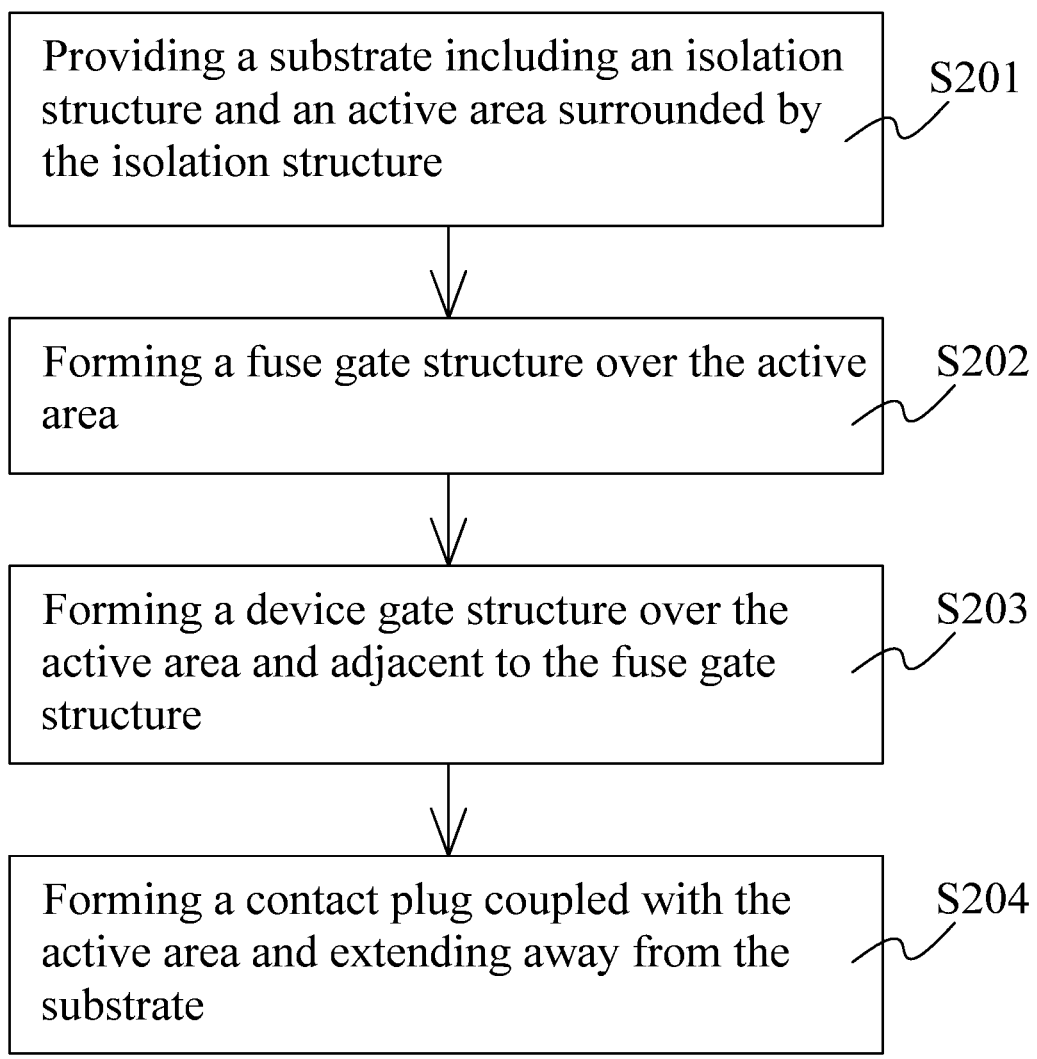
FIG. 6 is a flow diagram illustrating a method of manufacturing a memory device in accordance with some embodiments of the present disclosure.

FIG. 6 is a flow diagram illustrating a method S200 of manufacturing a memory device 100 in accordance with some embodiments of the present disclosure, and FIGS. 7 to 20 illustrate cross-sectional views of intermediate stages in formation of the memory device 100 in accordance with some embodiments of the present disclosure.

The stages shown in FIGS. 7 to 20 are also illustrated schematically in the flow diagram in FIG. 6. In following discussion, the fabrication stages shown in FIGS. 7 to 20 are discussed in reference to process steps shown in FIG. 6. The method S200 includes a number of operations, and description and illustration are not deemed as a limitation to a sequence of the operations. The method S200 includes a number of steps (S201, S202, S203 and S204).

Figure 7:
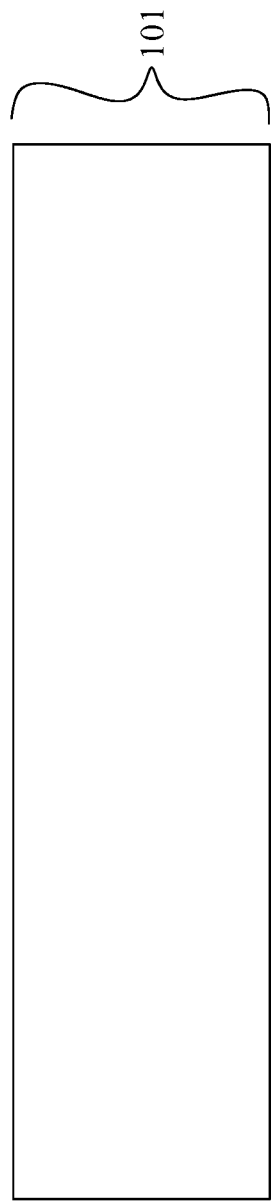
FIGS. 7 to 20 illustrate cross-sectional views of intermediate stages in the formation of a memory device in accordance with some embodiments of the present disclosure.

Referring to FIG. 7, a semiconductor substrate 101 is provided according to a step S201 in FIG. 6. In some embodiments, the semiconductor substrate 101 is semiconductive. In some embodiments, the semiconductor substrate 101 is a silicon substrate.

Figure 8:
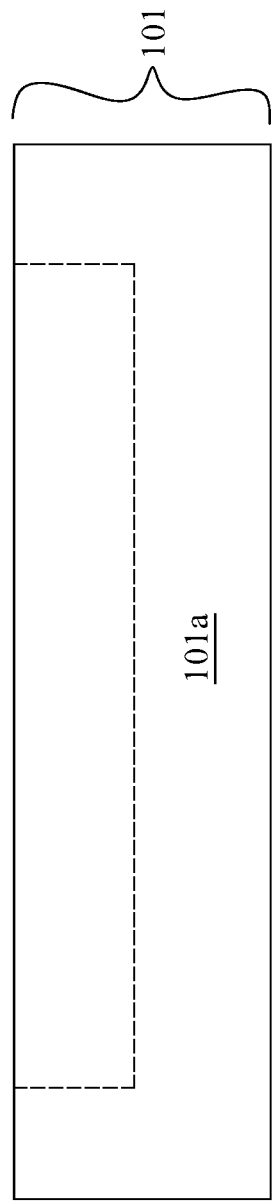

Referring to FIG. 8, the semiconductor substrate 101 includes an isolation structure 101a. In some embodiments, the isolation structure 101a is formed by forming a recess in a top surface of the semiconductor substrate 101 by a lithography process and an etching process (e.g., an anisotropic etching process). Subsequently, an insulating material fills the recess by a deposition process, such as a chemical vapor deposition (CVD) process.

Further, portions of the insulating material above the top surface of the semiconductor substrate 101 are removed by a planarization process, and remaining portions of the insulating material form the isolation structure 101a. For instance, the planarization process may include a polishing process, an etching process or a combination thereof.

Figure 9:
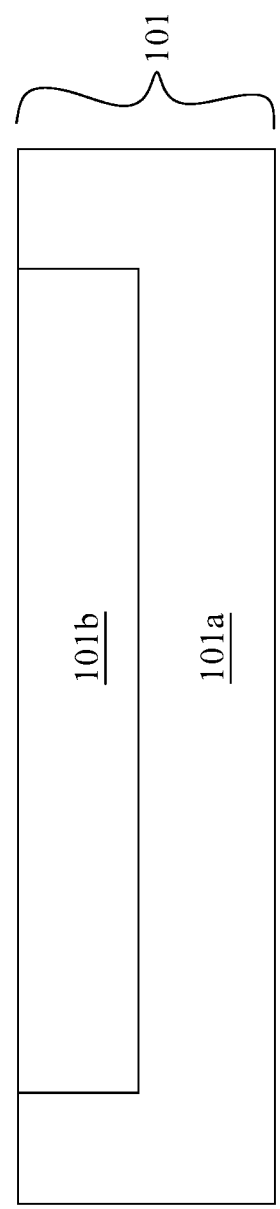

Referring to FIG. 9, the semiconductor substrate 101 includes an active area 101b. In some embodiments, the active area 101b is formed after the formation of the isolation structure 101a. In some embodiments, the isolation structure 101a defines a boundary of the active area 101b subsequently formed. In some embodiments, the active area 101b is formed, and is surrounded by the isolation structure 101a.

In some embodiments, the active area 101b is formed by an ion implantation process or an ion doping process. During the ion implantation process, the isolation structure 101a serves as a mask pattern. In alternative embodiments, the ion implantation process is performed before the formation of the isolation structure 101a. In such alternative embodiments, a well region is formed by the ion implantation process, and the isolation structure 101a is then formed in the well region. Portions of the well region laterally surrounded by the isolation structure 101a form the active area 101b. In some embodiments, the semiconductor substrate 101 as shown in FIG. 9 has a configuration similar to that of the semiconductor substrate 101 described above or those illustrated in any one of FIGS. 1 to 5.

Figure 10:

Referring to FIG. 10, a fuse gate structure 102 is formed over the active area 101b of the semiconductor substrate 101 according to a step S202 in FIG. 6. In some embodiments, the fuse gate structure 102 is formed by forming a fuse gate dielectric 102a over the active area 101b and then forming a fuse gate electrode 102b over the fuse gate dielectric 102a.

In some embodiments, the fuse gate dielectric 102a is formed by an oxidation process or a deposition process such as a CVD process. In some embodiments, the fuse gate electrode 102b is formed by a deposition process, such as a CVD process. In some embodiments, the fuse gate structure 102 as shown in FIG. 10 has a configuration similar to that of the fuse gate structure 102 described above or those illustrated in any one of FIGS. 1 to 5.

Figure 11:
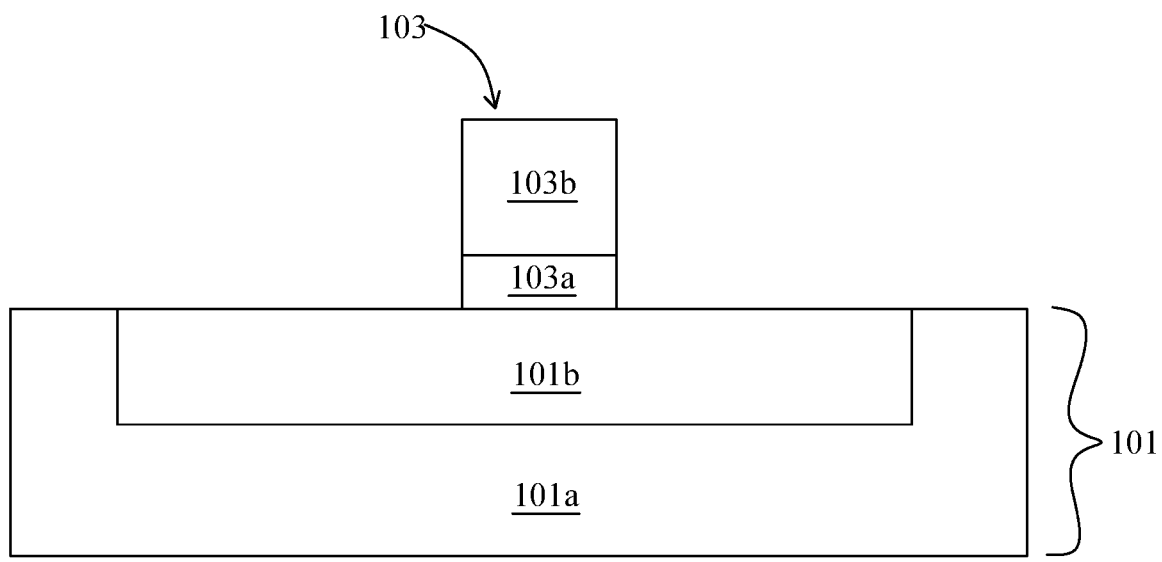

Referring to FIG. 11, a device gate structure 103 is formed over the active area 101b of the semiconductor substrate 101 according to a step S203 in FIG. 6. In some embodiments, the device gate structure 103 is formed by forming a device gate dielectric 103a over the active area 101b and then forming a device gate electrode 103b over the device gate dielectric 103a.

In some embodiments, the device gate dielectric 103a is formed by an oxidation process or a deposition process such as a CVD process. In some embodiments, the device gate electrode 103b is formed by a deposition process, such as a CVD process. In some embodiments, the device gate structure 103 as shown in FIG. 11 has a configuration similar to that of the device gate structure 103 described above or those illustrated in any one of FIGS. 1 to 5.

Figure 12:
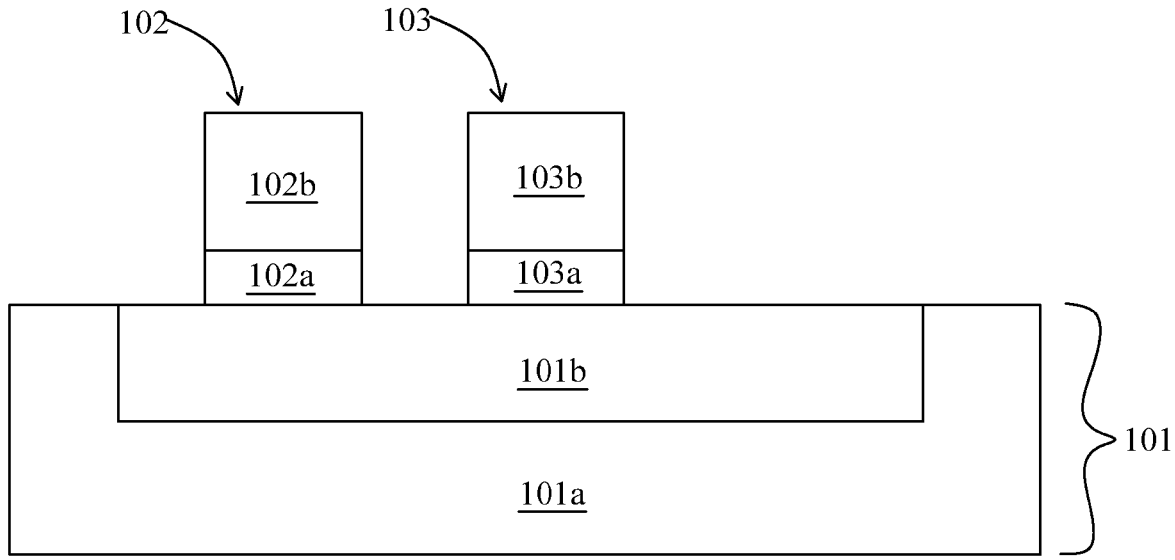

In some embodiments, the formation of the fuse gate structure 102 (step S202) and the formation of the device gate structure 103 (step S203) are performed separately and sequentially. In some embodiments as shown in FIGS. 10 and 12, the fuse gate structure 102 is formed prior to the formation of the device gate structure 103. In some embodiments as shown in FIGS. 11 and 12, the device gate structure 103 is formed prior to the formation of the fuse gate structure 102.

In some embodiments as shown in FIG. 12, the fuse gate structure 102 and the device gate structure 103 are formed simultaneously. In some embodiments, the fuse gate structure 102 is adjacent to the device gate structure 103. In some embodiments, the fuse gate structure 102 and the device gate structure 103 are parallel and are formed over the active area 101b.

Figure 13:
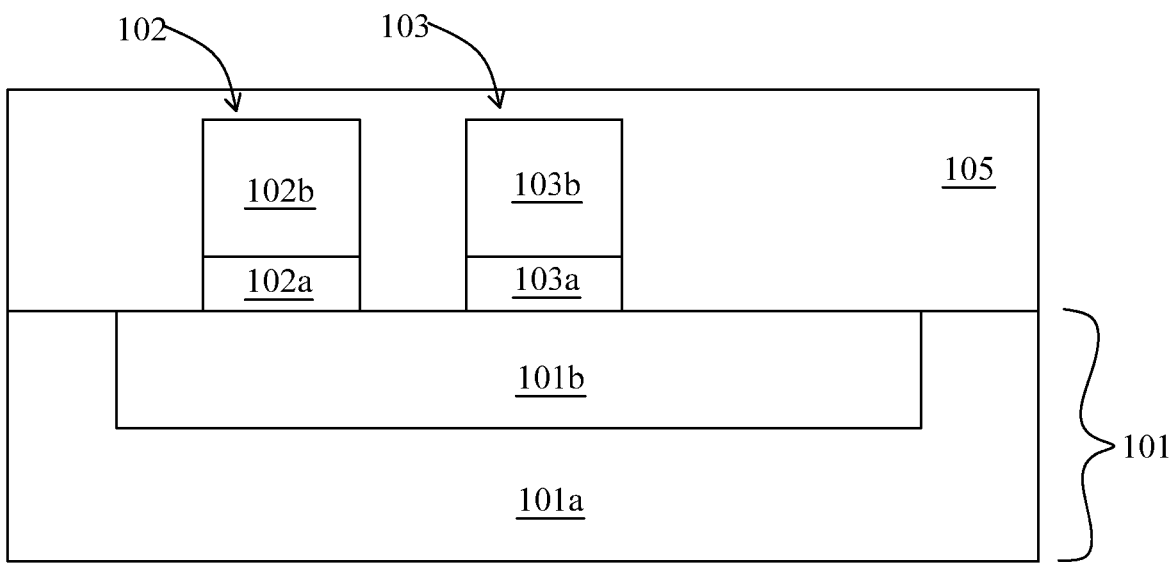

Referring to FIGS. 13 to 17, a contact plug 104 is formed according to a step S204 in FIG. 6. In some embodiments, the contact plug 104 is coupled to the active area 101b and extends away from the semiconductor substrate 101. In some embodiments as shown in FIG. 13, a dielectric layer 105 is disposed over the semiconductor substrate 101 by a deposition process such as a CVD process.

In some embodiments, the fuse gate structure 102 and the device gate structure 103 are surrounded by the dielectric layer 105. In some embodiments, the dielectric layer 105 covers the top surface of the semiconductor substrate 101. The active area 101b is also covered by the dielectric layer 105.

Figure 14:
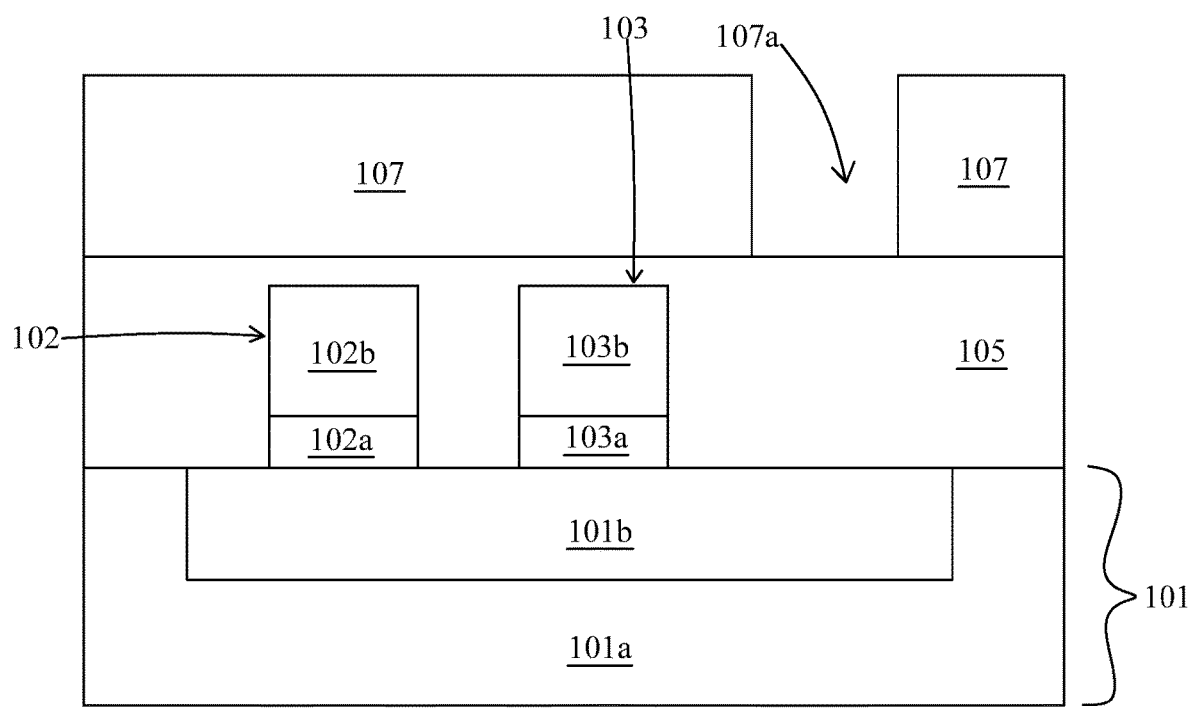

After the disposing of the dielectric layer 105 over the semiconductor substrate 101, a first patterned photoresist 107 is disposed over the dielectric layer 105 as shown in FIG. 14. In some embodiments, the first patterned photoresist 107 includes a first opening 107a exposing a portion of the dielectric layer 105.

In some embodiments, the first patterned photoresist 107 is formed by disposing a photoresist material over the dielectric layer 105, covering some portions of the photoresist material, and then removing exposed portions of the photoresist material to pattern the photoresist material to form the first patterned photoresist 107. In some embodiments as shown in FIG. 15, the portion of the dielectric layer 105 exposed through the first patterned photoresist 107 is removed by etching or any other suitable process.

Figure 15:
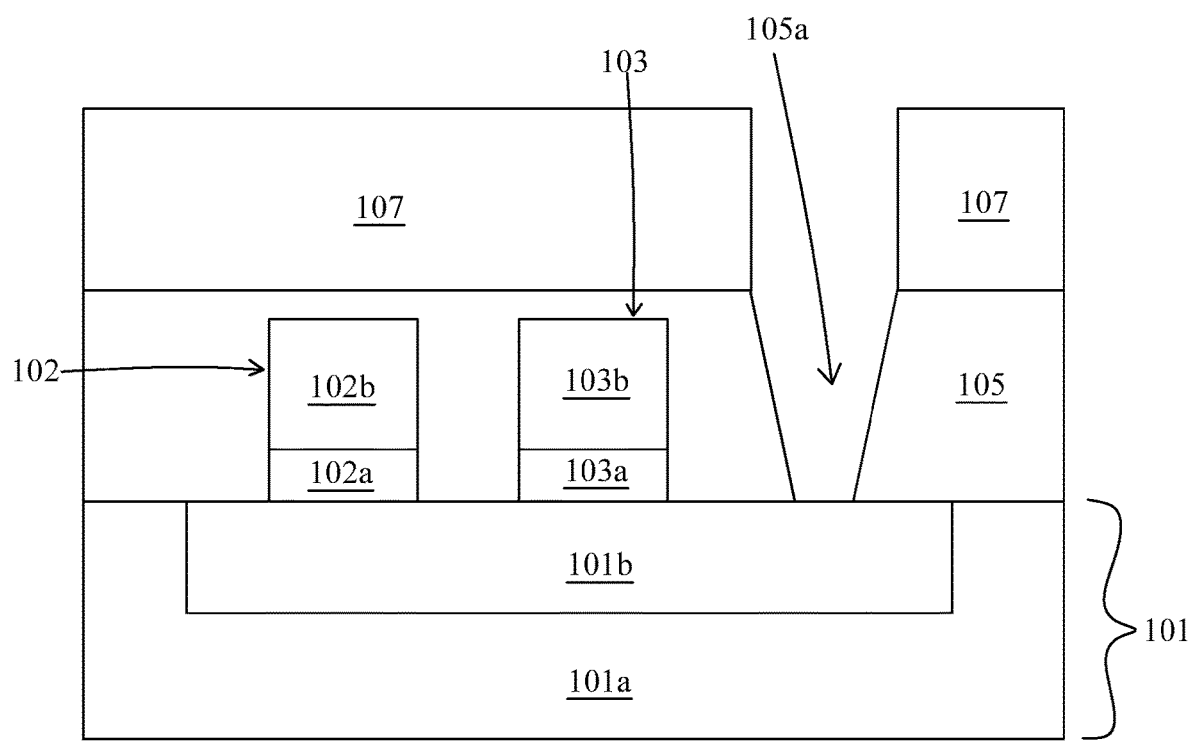
Figure 16:
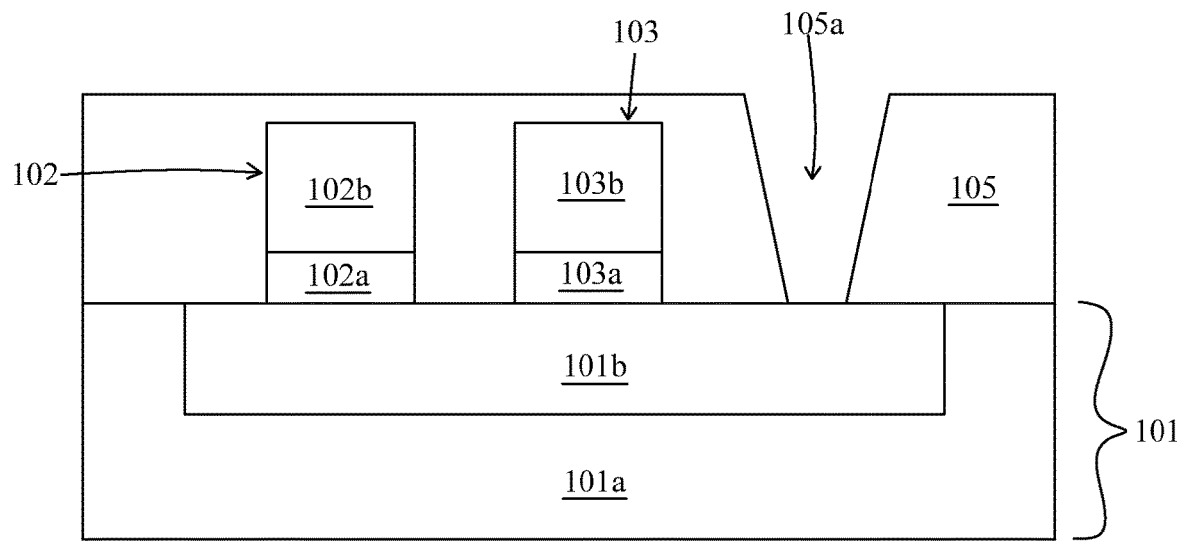

After the removal of the exposed portion of the dielectric layer 105, a recess 105a is formed as shown in FIG. 15. In some embodiments, the recess 105a has a rectangular or tapered shape. In some embodiments, the recess 105a extends through the dielectric layer 105 to expose a portion of the active area 101b. After the formation of the recess 105a, the first patterned photoresist 107 is removed by etching, stripping or any other suitable process as shown in FIG. 16.

Figure 17:
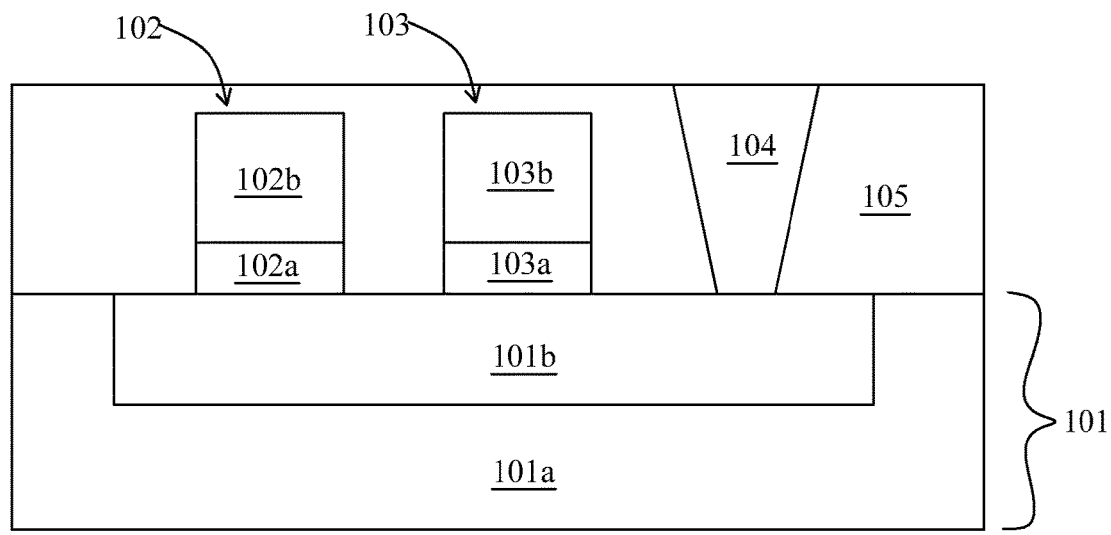

In some embodiments, the contact plug 104 is formed after the disposing of the dielectric layer 105. After the formation of the recess 105a, a conductive material fills the recess 105a to form the contact plug 104 as shown in FIG. 17. In some embodiments, the contact plug 104 is formed by electroplating or any other suitable process. In some embodiments, the contact plug 104 as shown in FIG. 17 has a configuration similar to that of the contact plug 104 described above or those illustrated in any one of FIGS. 1 to 5.

Figure 18:
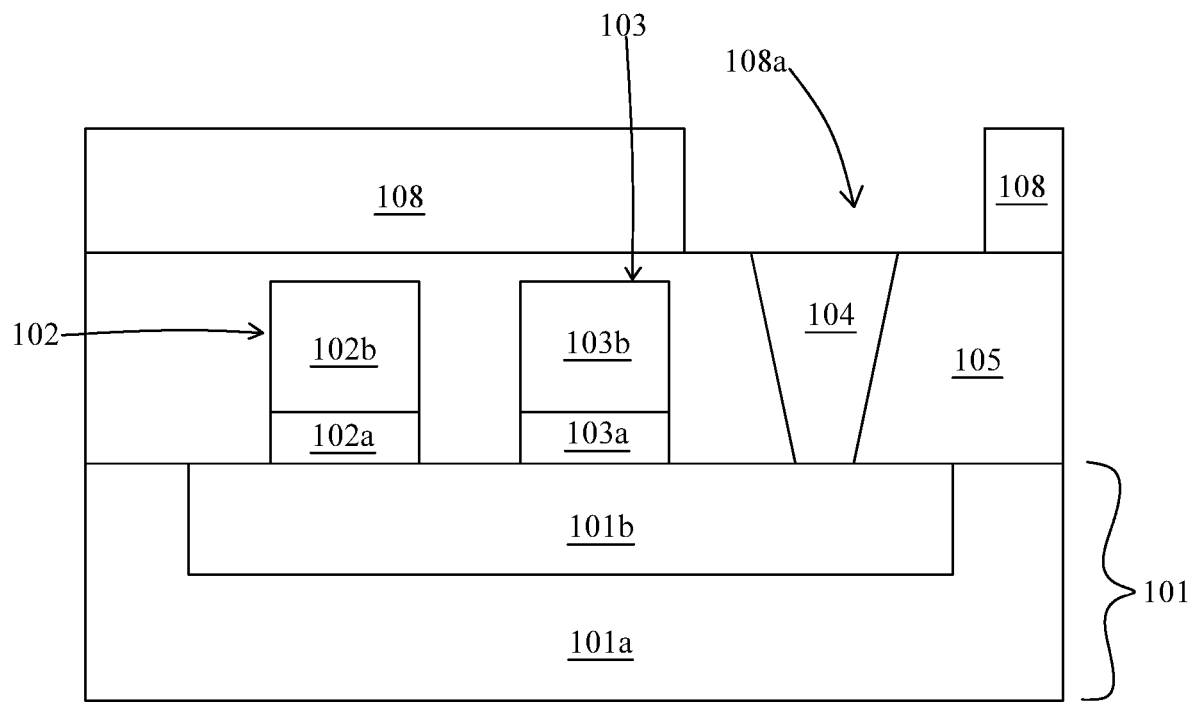

After the formation of the contact plug 104, a second patterned photoresist 108 is disposed over the dielectric layer 105 as shown in FIG. 18. In some embodiments, the second patterned photoresist 108 includes a second opening 108a exposing the contact plug 104 and a portion of the dielectric layer 105.

In some embodiments, the second patterned photoresist 108 is formed by disposing a photoresist material over the dielectric layer 105, covering some portions of the photoresist material, and then removing exposed portions of the photoresist material to pattern the photoresist material to form the second patterned photoresist 108.

Figure 19:
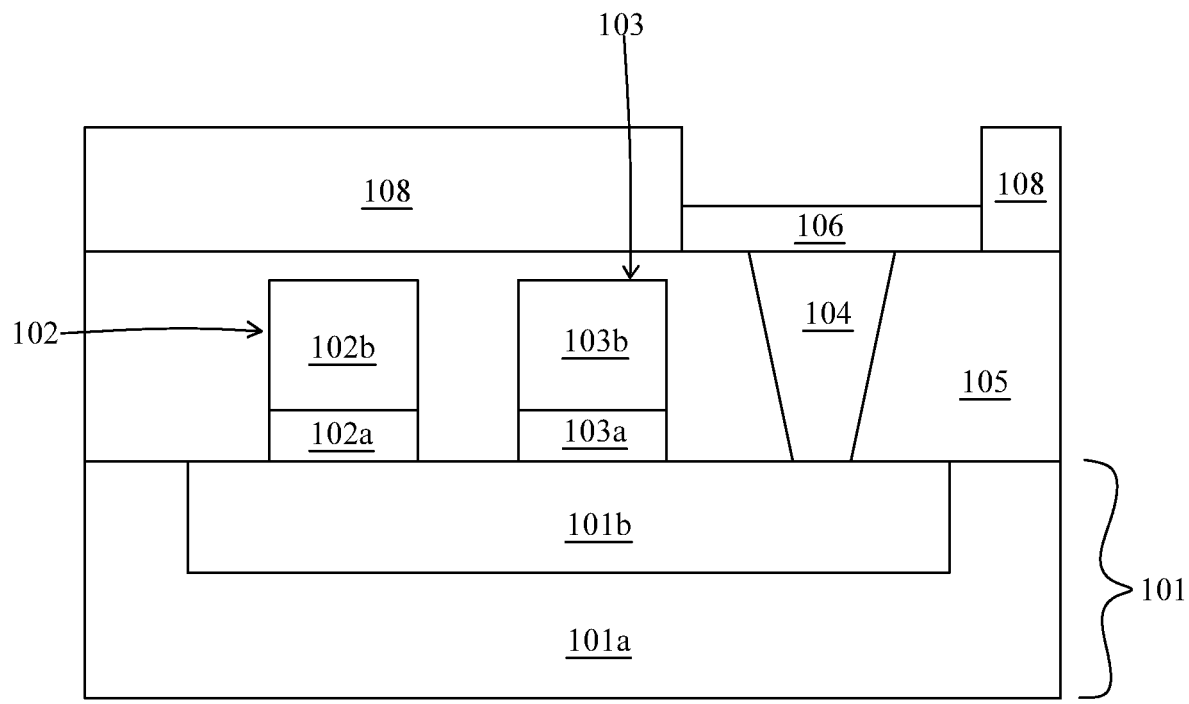
Figure 20:
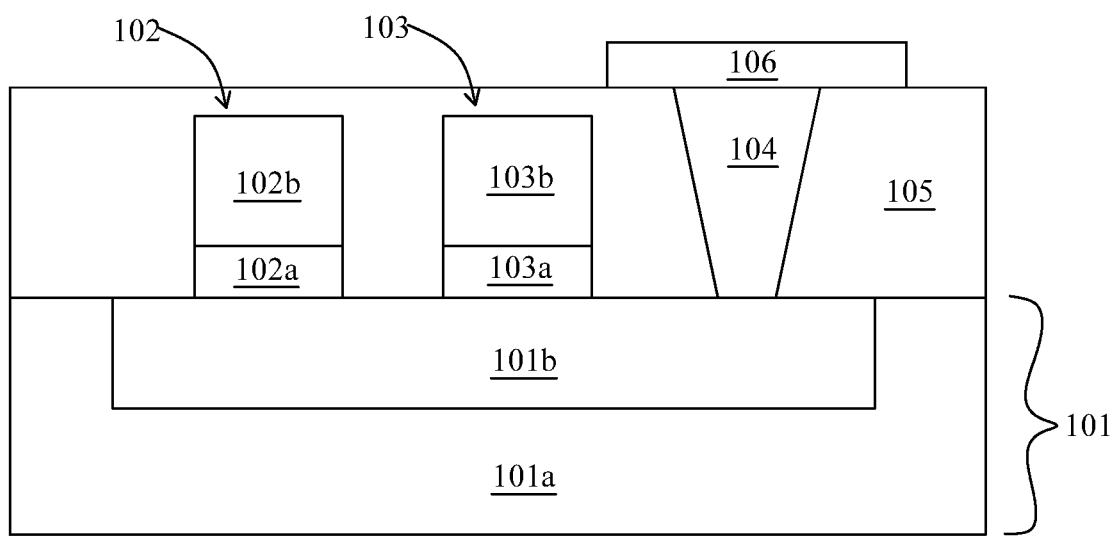

In some embodiments as shown in FIG. 19, a metallic member 106 is formed over the contact plug 104 and the dielectric layer 105 and within the second opening 108a. In some embodiments, the metallic member 106 is formed by electroplating or any other suitable process. After the formation of the metallic member 106, the second patterned photoresist 108 is removed by etching, stripping or any other suitable process as shown in FIG. 20. In some embodiments, the metallic member 106 as shown in FIG. 20 has a configuration similar to that of the metallic member 106 described above or those illustrated in any one of FIGS. 4 to 5.

In an aspect of the present disclosure, a memory device is provided. The memory device includes a semiconductor substrate including an isolation structure and an active area surrounded by the isolation structure; a fuse gate structure disposed over the active area; a device gate structure disposed over the active area and adjacent to the fuse gate structure; and a contact plug coupled to the active area and extending away from the semiconductor substrate, wherein the active area is disposed below and crosses under the fuse gate structure and the device gate structure.

In another aspect of the present disclosure, a memory device is provided. The memory device includes a substrate including an isolation structure and a plurality of active areas surrounded by the isolation structure; a fuse gate structure disposed above and crossing over the plurality of active areas; a device gate structure disposed above and crossing over the plurality of active areas and disposed adjacent to the fuse gate structure; and a plurality of contact plugs correspondingly coupled to the plurality of active areas and extending away from the substrate, wherein each of the plurality of active areas is at least partially disposed under the fuse gate structure and the device gate structure.

In another aspect of the present disclosure, a method of manufacturing a memory device is provided. The method includes steps of providing a substrate including an isolation structure and an active area surrounded by the isolation structure; forming a fuse gate structure over the active area; forming a device gate structure over the active area and adjacent to the fuse gate structure; and forming a contact plug coupled to the active area and extending away from the substrate, wherein the fuse gate structure and the device gate structure are parallel and are formed over the active area.

In conclusion, because a signal can be transmitted through an active area over a substrate rather than through a metallic interconnect above the substrate, an area occupied by the metallic interconnect can be substantially reduced or even no longer occupied. Further, because a device gate structure can be formed adjacent to a fuse gate structure, an area occupied by the device gate structure can also be substantially reduced. Therefore, an overall dimension of the memory device can be substantially decreased.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A memory device, comprising:
   a semiconductor substrate including an isolation structure and an active area surrounded by the isolation structure, wherein a bottom surface and sidewalls of the active area are coupled with the isolation structure;
   a fuse gate structure disposed over the active area;
   a device gate structure disposed over the active area and adjacent to the fuse gate structure; and
   a contact plug coupled to the active area and extending away from the semiconductor substrate, wherein the active area is disposed below and crosses under the fuse gate structure and the device gate structure;

wherein two horizontal ends of the active area are exposed from the fuse gate structure and the contact plug respectively.

2. The memory device according to claim 1, wherein the active area, from a top view, extends between the contact plug and the fuse gate structure.

3. The memory device according to claim 1, wherein the fuse gate structure and the device gate structure are parallel.

4. The memory device according to claim 1, wherein the fuse gate structure and the device gate structure extend vertically above the active area.

5. The memory device according to claim 1, wherein the active area is substantially perpendicular, from a top view, to the fuse gate structure and the device gate structure.

6. The memory device according to claim 1, wherein the device gate structure is disposed between the fuse gate structure and the contact plug.

7. The memory device according to claim 1, wherein an electric current can flow from the contact plug to the fuse gate structure through the active area.

8. The memory device according to claim 1, wherein the fuse gate structure includes a fuse gate dielectric disposed over the semiconductor substrate, and a fuse gate electrode disposed over the fuse gate dielectric.

9. The memory device according to claim 8, wherein the fuse gate dielectric is at least partially disposed on the active area.

10. The memory device according to claim 1, wherein the device gate structure includes a device gate dielectric disposed over the semiconductor substrate, and a device gate electrode disposed over the device gate dielectric.

11. The memory device according to claim 10, wherein the device gate dielectric is at least partially disposed on the active area.

12. The memory device according to claim 1, further comprising a metallic member disposed over and coupled to the contact plug.

13. The memory device according to claim 12, wherein an area above the fuse gate structure is free of the metallic member.

14. The memory device according to claim 12, wherein the metallic member is electrically connected to the fuse gate structure through the active area and the contact plug.

15. A memory device, comprising:
a substrate including an isolation structure and a plurality of active areas surrounded by the isolation structure, wherein a bottom surface and sidewalls of each of the plurality of the active areas are coupled with the isolation structure;
a fuse gate structure coupled to and crossing over the plurality of active areas;
a device gate structure coupled to and crossing over the plurality of active areas, wherein the device gate structure is adjacent to the fuse gate structure; and
a plurality of contact plugs correspondingly coupled to the plurality of active areas and extending away from the substrate,
wherein each of the plurality of active areas is at least partially disposed under the fuse gate structure and the device gate structure;
wherein two horizontal ends of each of the plurality active areas are exposed from the fuse gate structure and the contact plug respectively.

16. The memory device according to claim 15, wherein the plurality of active areas are separated from each other by the isolation structure.

17. The memory device according to claim 15, wherein the plurality of contact plugs are aligned with each other.

18. The memory device according to claim 15, wherein the plurality of contact plugs are separated from each other by a dielectric layer disposed over the substrate.

19. The memory device according to claim 15, wherein the fuse gate structure and the device gate structure are parallel and cross over the plurality of active areas.

20. The memory device according to claim 15, wherein a signal can be transmitted from one of the plurality of contact plugs to the fuse gate structure through one of the plurality of active areas.

* * * * *